(12) United States Patent
Bencuya et al.

(10) Patent No.: US 6,423,623 B1
(45) Date of Patent: *Jul. 23, 2002

(54) LOW RESISTANCE PACKAGE FOR SEMICONDUCTOR DEVICES

(75) Inventors: Izak Bencuya, Saratoga, CA (US); Maria Christina B. Estacio, Bacayan (PH); Steven P. Sapp, Felton, CA (US); Consuelo N. Tangpuz; Gilmore S. Baje, both of Lapulapu (PH); Rey D. Maligro, Cordova (PH)

(73) Assignee: Fairchild Semiconductor Corporation, Portland, ME (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/141,184

(22) Filed: Aug. 27, 1998

Related U.S. Application Data

(60) Provisional application No. 60/088,651, filed on Jun. 9, 1998.

(51) Int. Cl.[7] .............................................. H01L 21/44
(52) U.S. Cl. ...................... 438/612; 438/613; 438/123; 257/737; 257/738; 257/782; 257/779; 257/780
(58) Field of Search ................................ 257/666, 673, 257/676, 678, 691, 737, 738, 780, 213, 782, 779; 438/612, 613, 123

(56) References Cited

U.S. PATENT DOCUMENTS

| | | | |
|---|---|---|---|
| 3,871,014 A | 3/1975 | King et al. ..................... 357/67 |
| 3,972,062 A | 7/1976 | Hopp ........................... 357/68 |
| 4,021,838 A | 5/1977 | Waewick ....................... 357/68 |
| 4,604,644 A | 8/1986 | Bekham et al. ................ 357/80 |
| 5,028,987 A | * | 7/1991 | Neugebauer et al. .......... 357/80 |
| 5,075,965 A | 12/1991 | Carey et al. ................... 29/840 |
| 5,143,865 A | * | 9/1992 | Hideshima et al. .......... 437/183 |
| 5,311,402 A | 5/1994 | Kobayashi et al. ........... 361/760 |
| 5,313,366 A | 5/1994 | Gaudenzi et al. ............. 361/760 |
| 5,367,435 A | 11/1994 | Andros et al. ............... 361/749 |
| 5,381,039 A | 1/1995 | Morrison ..................... 257/701 |
| 5,394,490 A | 2/1995 | Kato et al. .................... 385/14 |
| 5,397,921 A | 3/1995 | Karnezos ..................... 257/779 |
| 5,424,581 A | * | 6/1995 | Bourg et al. ................. 257/786 |
| 5,447,886 A | 9/1995 | Rai .............................. 437/183 |
| 5,448,114 A | 9/1995 | Kondoh et al. .............. 257/778 |
| 5,454,160 A | 10/1995 | Nickel ......................... 29/840 |
| 5,477,087 A | 12/1995 | Kawakita et al. ........... 257/737 |
| 5,510,758 A | 4/1996 | Fujita et al. ................. 333/247 |
| 5,512,786 A | 4/1996 | Imamura et al. ............ 257/780 |
| 5,532,512 A | 7/1996 | Fillion et al. ................ 257/686 |
| 5,654,590 A | 8/1997 | Kuramochi .................. 257/778 |
| 5,703,405 A | 12/1997 | Zeber .......................... 257/777 |
| 5,726,501 A | 3/1998 | Matsubara ................... 257/778 |
| 5,726,502 A | 3/1998 | Beddingfield ................ 257/797 |
| 5,729,440 A | 3/1998 | Jimarez et al. .............. 361/779 |
| 5,734,201 A | 3/1998 | Djennas et al. ............. 257/783 |
| 5,739,585 A | 4/1998 | Akram et al. ................ 257/698 |
| 6,249,041 B1 | * | 6/2001 | Kasem et al. ................ 257/666 |

FOREIGN PATENT DOCUMENTS

JP          408064634 A    *    3/1996

* cited by examiner

*Primary Examiner*—David L. Talbott
*Assistant Examiner*—Luan Thai
(74) *Attorney, Agent, or Firm*—Townsend and Townsend and Crew LLP

(57) ABSTRACT

A packaging technique that significantly reduces package resistance. According to the invention, lead frames external to the package are brought in direct contact to solder balls on the surface of the silicon die inside the package molding, eliminating resistive wire interconnections. The packaging technique of the present invention is particularly suitable for power transistors.

4 Claims, 3 Drawing Sheets

LOW RESISTANCE PACKAGE FOR SEMICONDUCTOR DEVICES

CROSS-REFERENCES TO RELATED APPLICATIONS

This application is a Provisional of Ser. No. 60/088,651, filed Jun. 9, 1998.

BACKGROUND OF THE INVENTION

The present invention relates in general to semiconductor packaging, and in particular to a low resistance, high current semiconductor package that is particularly well suited for power devices.

Semiconductor power switching devices and particularly power MOSFET devices continue to push the lower limits of on-state resistance. While silicon process technology has advanced significantly in the past decade, essentially the same decades-old package technology continues as the primary packaging means. Epoxy or solder die attach along with aluminum or gold wire interconnects is still the preferred power device package methodology. FIG. 1 illustrates typical package wiring for a power MOSFET 100. Wire bonds 108 connect the device (or die) 100 to the lead frames for source terminal 104 and gate terminal 106. Even if provided in multiple locations (as shown for source connections 108), this type of wire bonding can add relatively large resistance to the otherwise low on-state resistance of the high current MOSFET. In addition, placement of the wires on the metalized surface 110 of the device is constrained, among other factors, by wire length, bond size relative to the bond pad area, and vertical clearance inside the molded body. Even the relatively thick top metalization can add significantly to the resistance and can be compounded by wire interconnect placement limitations.

There is therefore a need for improved packaging techniques that minimize resistance for semiconductor devices such as power MOSFETs.

SUMMARY OF THE INVENTION

The present invention provides a low resistance wireless package for semiconductor devices such as power MOSFETs. Broadly, the package according to the present invention includes an array of solder interconnections that provides a direct connection between one conductive surface of the semiconductor device and a lead frame element with leads that exit the molded package body. Resistive wire interconnections between the device and the lead frame are thus eliminated and replaced by relatively low-resistance lead frame elements. Furthermore, the present invention allows the size and shape of the lead frame to be tailored to fit the device and to minimize its electrical and thermal resistance. The distributed solder connections on the top metal reduces its resistance to negligible amounts. The combined effect of metal resistance reduction and wire resistance elimination results in a drastic reduction in the package resistance. In a preferred embodiment, the direct lead frame-to-device solder array connection to one conductive surface (e.g., top side) is combined with a die attach mechanism to connect to the other conductive surface (e.g., bottom side) of the device.

Accordingly, the present invention provides a semiconductor package including a silicon die encapsulated by a protective molding; a plurality of solder balls disposed across and making contact to a conductive layer on a top surface of the die; and a metal lead frame making direct contact to the plurality of solder balls and extending outside the protective molding. In one embodiment, a bottom surface of the die is attached directly to a second metal lead frame through a die attach process, with the second metal lead frame also extending outside the protective molding.

In a specific embodiment, the silicon die comprises a power MOSFET transistor with the top surface metalized and forming a source terminal connecting to the plurality of the solder balls, and the bottom surface forming a drain terminal connecting to the second metal lead frame. Further, a third metal lead frame directly contacts a solder ball connecting to a gate terminal of the MOSFET on the top surface of the die.

In yet another embodiment, the present invention uses a solder ball array mask to create cavities in the passivation layer. the cavities receive the plurality of solder balls and restrict their movement to promote wicking of the solder between the pad surface and the top frame element.

A better understanding of the nature and advantages of the low resistance wireless package of the present invention may be gained with reference to the detailed description and drawings below.

DESCRIPTION OF THE SPECIFIC EMBODIMENTS

Figure 2:
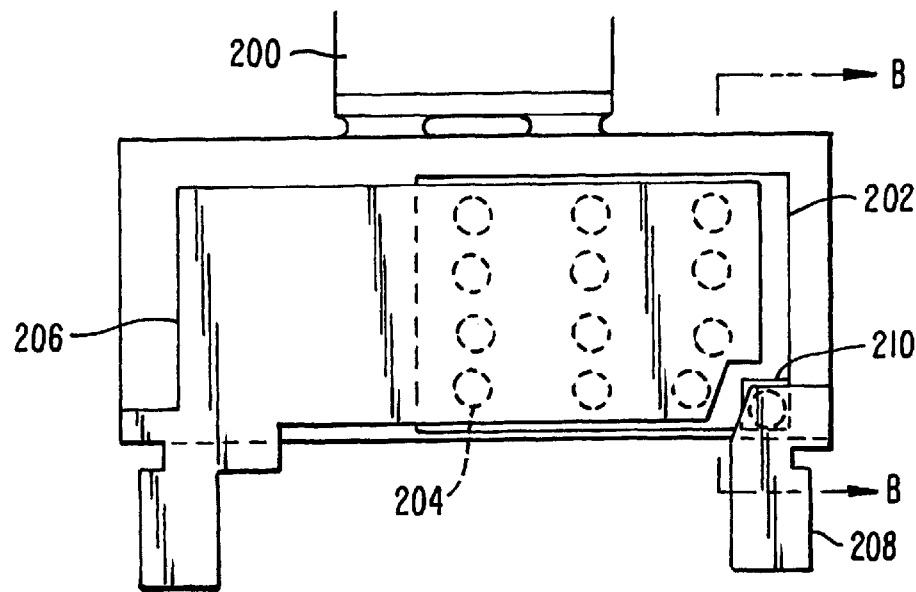
FIG. 2 shows a top view for the wireless package before molding according to the present invention.

Referring to FIG. 2, there is shown a top view of a pre-molding wireless package for a three-terminal power MOSFET according to an exemplary embodiment of the present invention. A metal lead frame 200 attaches to the bottom side of the silicon die 202 to provide connection to the drain terminal of the power MOSFET. This can be accomplished using a variety of methods including conductive epoxy, or soft or hard solder connection. An array of solder balls 204 is formed on the top surface of the die at predetermined locations to facilitate connection to the source node of the transistor. A source top lead frame 206 is brought in direct contact and is soldered to the array of solder balls 204 to form the source terminal. A gate top lead frame 208 makes connection to the gate bonding pad area 210. Since the resistance of the gate terminal is not a concern, this connection can be made either by a direct lead 208 to solder ball pasting as shown, or by conventional wire bonding. In the exemplary embodiment shown in FIG. 2, lead frame 206 connecting to the source node of the transistor is almost as wide as the die. Accordingly, this arrangement eliminates resistive wire interconnections and replaces them by low resistance lead frame elements. Furthermore, the size and shape of lead frames 206 and 208, which are commonly made of, for example Copper, can be tailored to fit the device and to minimize its electrical and thermal resistance.

Figure 1:
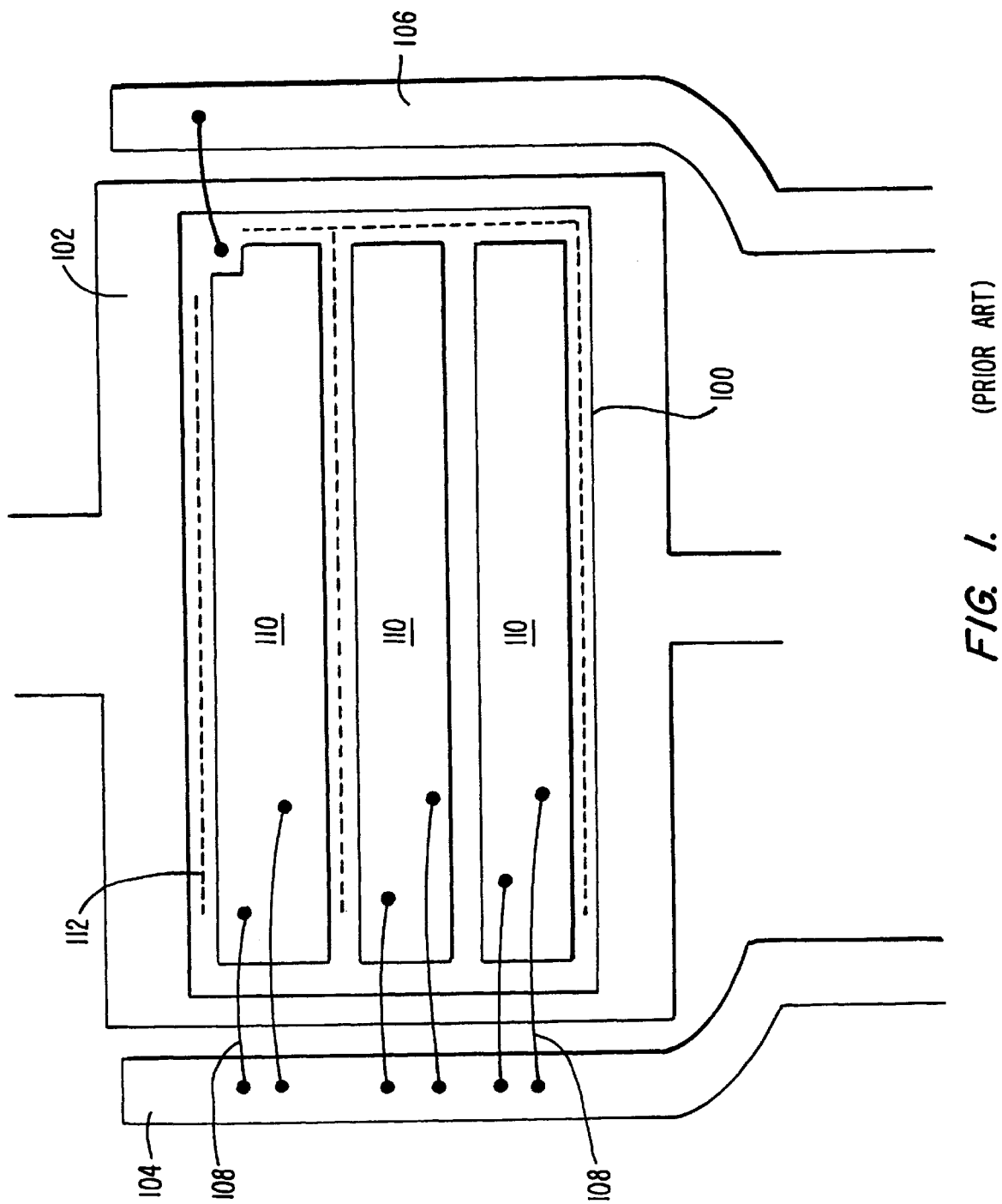
FIG. 1 illustrates conventional package wiring for a power MOSFET.

The resistance of the top metal layer 110 (in FIG. 1) also contributes significantly to the overall resistance of the chip and package combination. Referring back to FIG. 1, the resistance of top metal layer 110 is typically minimized by designing the metal in large blocks and by placing wires 108 to minimize the current path through the metal. However, input signal distribution buses 112 in the middle of the metal blocks break up the continuity of the top metal layer resulting in increased resistance. The present invention overcomes the top metal resistance by distributing an array of connection points over the entire surface of the metal as shown in FIG. 2 that provide for a low resistance continuous solder connection. In an exemplary embodiment such as the one shown in FIG. 2, the die may be, for example, 100 mils by 90 mils, and the array of solder balls 204 (e.g., each solder ball being 8 mils in diameter) may be made up of 12 distributed solder balls 204 for source connection and one solder ball for gate connection. The array includes four rows of three balls each as shown, with, for example, 0.8 millimeters spacing between the rows and, for example, 0.5 millimeter between the columns. This type of distributed connection points virtually eliminates the metal resistance by reducing the length of the current path through the top metal. It is to be understood that the values given for the dimensions of the exemplary package shown in FIG. 2 are for illustrative purposes only, and that depending on the size of the die a smaller or a larger array of solder balls may be used.

Figure 3:
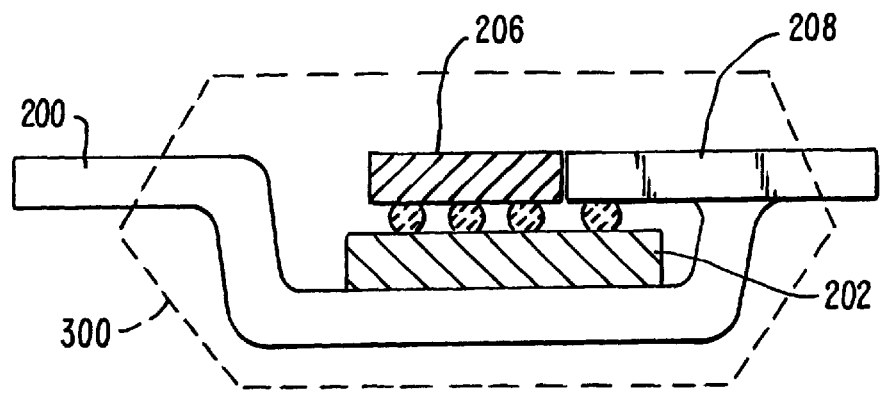
FIG. 3 is a cross-sectional view of the wireless package of the present invention.

FIG. 3 is a cross-sectional view along section B—B of FIG. 2 showing the wireless package according to the present invention. The same reference numerals are used in FIG. 3 to identify the same elements in FIG. 2. FIG. 3 illustrates how die 202 is connected at its substrate to drain lead frame 200 via a die-attach process, while the top side source and gate terminals connect to their respective lead frames 206 and 208 via a direct lead frame to solder ball array 204 connection. As shown in FIG. 3, lead frames 200, 206 and 208 directly extend outside the package molding 300 to form the external pins of the device.

Figure 4:
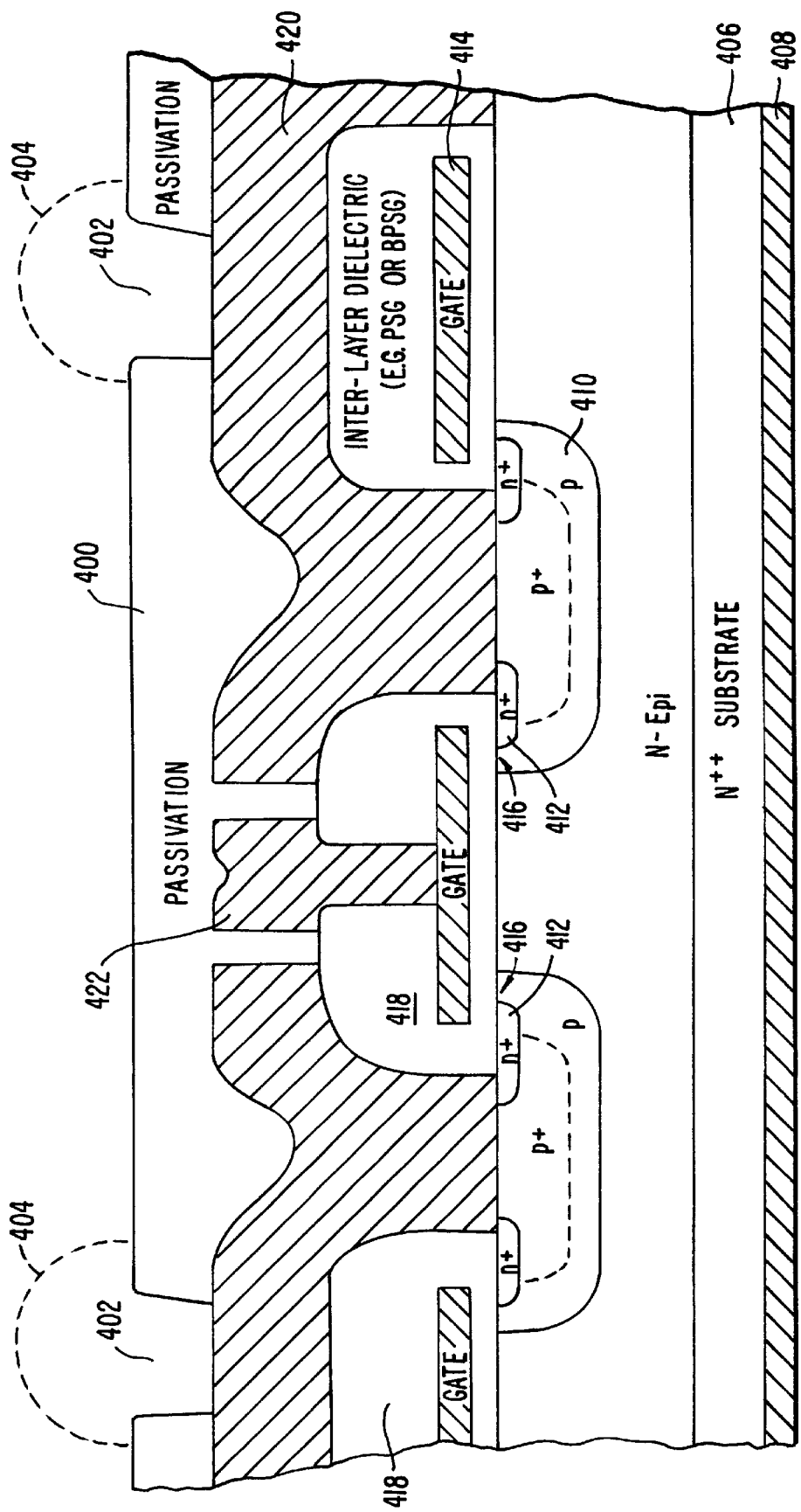
FIG. 4 is a cross-sectional view of a vertical power MOSFET illustrating the use of a passivation layer to control connections to a solder array according to the present invention.

Uncontrolled wetting of a continuous pad of solder may result in an electrical short between the top surface conductors of the power transistor, and inconsistent wetting of the solder. Inconsistent wetting gives rise to variations in connection points that causes large fluctuations in the package resistance. To control the location of the solder connections and prevent shorting between the separate connections on the top surface, the present invention provides in a preferred embodiment, a mechanism for controlling the solder flow. Using a solder array mask the present invention defines specific pad areas that are capable of being wetted by the solder. These pads are in the form of a cavity in a common passivation material and are designed to limit the movement of the solder and promote wicking of the solder between the pad surface and the top frame element. FIG. 4 shows a cross-sectional view of a vertical power MOSFET. A highly doped N-type substrate 406 forms the drain node of the transistor with direct connection to a drain metal layer 408. The source node of the transistor is formed by N-type diffusion regions 412 inside P-type wells 410. The gate node 414 is then formed above channel regions 416 surrounded by an inter-layer dielectric 418 (e.g., PSG, or BPSG). The source metal layer 420 is then formed on top making contact to source nodes 416 through openings in the inter-layer dielectric material. Gate metal layer 422 makes connection to gate node 414 in a similar fashion. A passivation layer 400 is then formed on the top surface of the device. As shown in FIG. 4, a solder array mask creates cavities 402 at predetermined locations across passivation layer 400. Cavities 402 receive solder balls 404 and restrict the movement of the solder balls to secure consistent and reliable connections at the desired locations. This consistency in the attachment of the top frame element to the die improves yield in a high capacity production environment.

It is to be understood that while the packaging technique of the present invention has been described in connection with a power MOSFET, the same technique can be used for other types of semiconductor devices. Similarly, the teachings of the present invention can be extended to variations in packaging techniques such as using clips to make connections between the die and the lead frame.

In conclusion, the present invention provides a packaging technique that significantly reduces package resistance. Lead frames are brought in direct contact to solder balls on the surface of the silicon die. Thus, resistive wire interconnections are eliminated. While the above is a complete description of the preferred embodiment of the present invention, it is possible to use various alternatives, modifications and equivalents. For example, packages housing multiple power transistors can be manufactured using the wireless technique taught by the present invention. Semiconductor circuitry other than power transistors can also benefit the wireless packaging technique of the present invention. Therefore, the scope of the present invention should be determined not with reference to the above description but should, instead, be determined with reference to the appended claims, along with their full scope of equivalents.

What is claimed is:

1. A packaging method for a silicon die, comprising the steps of:

disposing a plurality of solder balls on a top surface of the silicon die;

bringing a first metal lead frame in direct contact with the plurality of solder balls;

directly attaching a substrate side of the silicon die to a second metal lead frame using a die attach process; and encapsulating the silicon die with a protective mold such that the first and second metal lead frames extend outside the protective mold.

2. The packaging method of claim 1 further comprising a step of bringing a third metal lead frame in direct contact with a solder ball located at an edge of the silicon die, wherein the third metal lead frame also extends outside the protective mold.

3. The packaging method of claim 1 further comprising the steps of:

covering the top surface of the silicon die with a passivation layer; and forming a plurality of cavities in the passivation layer corresponding to, and for receiving, the plurality of solder balls.

4. The packaging method of claim 1 wherein the step of disposing distributes the plurality of solder balls in a two-dimensional array across the top surface of the silicon die.

* * * * *